United States Patent [19]
Ooishi et al.

[11] Patent Number: 6,075,732
[45] Date of Patent: *Jun. 13, 2000

[54] SEMICONDUCTOR MEMORY DEVICE WITH REDUNDANCY CIRCUIT

[75] Inventors: Tsukasa Ooishi; Yoshio Matsuda; Kazutami Arimoto; Masaki Tsukude; Kazuyasu Fujishima, all of Hyogo-ken, Japan

[73] Assignee: Mitsubishi Denki Kabushiki Kaisha, Tokyo, Japan

[*] Notice: This patent is subject to a terminal disclaimer.

[21] Appl. No.: 09/334,917

[22] Filed: Jun. 17, 1999

Related U.S. Application Data

[63] Continuation of application No. 08/882,758, Jun. 26, 1997, Pat. No. 5,982,678, which is a continuation of application No. 08/626,408, Apr. 2, 1996, abandoned, which is a continuation of application No. 08/180,166, Jan. 11, 1994, Pat. No. 5,504,713, which is a continuation of application No. 07/958,466, Oct. 8, 1992, Pat. No. 5,289,417, which is a continuation of application No. 07/516,644, Apr. 30, 1990, abandoned.

[30] Foreign Application Priority Data

May 9, 1989 [JP] Japan .................................. 1-116527

[51] Int. Cl.[7] ...................................................... G11C 7/00
[52] U.S. Cl. ..................................... 365/200; 365/189.07
[58] Field of Search .............................. 365/200, 189.07; 371/10.2, 10.3

[56] References Cited

U.S. PATENT DOCUMENTS

| | | |
|---|---|---|
| 4,365,319 | 12/1982 | Takmae . |
| 4,389,715 | 6/1983 | Eaton, Jr. et al. . |
| 4,459,685 | 7/1984 | Sud et al. ................................. 365/200 |
| 4,639,897 | 1/1987 | Wacyk . |
| 4,641,286 | 2/1987 | Shimotori et al. . |
| 4,648,075 | 3/1987 | Segawa et al. . |
| 4,803,656 | 2/1989 | Takemae ................................. 365/200 |
| 4,807,191 | 2/1989 | Flannagan ........................... 365/200 X |
| 4,837,747 | 6/1989 | Dosaka et al. . |
| 4,860,260 | 8/1989 | Saito et al. . |
| 4,879,687 | 11/1989 | Okamoto et al. . |
| 4,885,720 | 12/1989 | Miller et al. . |
| 4,908,798 | 3/1990 | Urai . |
| 4,918,662 | 4/1990 | Kondo . |
| 4,998,223 | 3/1991 | Akaogi . |

FOREIGN PATENT DOCUMENTS

| | | |
|---|---|---|
| 60-103469 | 6/1985 | Japan . |
| 62-37479 | 8/1987 | Japan . |
| 63-160095 | 7/1988 | Japan . |

*Primary Examiner*—Huan Hoang
*Attorney, Agent, or Firm*—McDermott, Will & Emery

[57] ABSTRACT

A semiconductor memory device comprises two memory cell arrays (1a, 1b) in which a block divisional operation is performed. Two spare rows (2a, 2b) are provided corresponding to the two memory cell arrays (1a, 1b). Spare row decoders (5a, 5b) are provided for selecting the spare rows (2a, 2b), respectively. One spare row decoder selecting signal generation circuit (18) used in common by the spare row decoders (5a, 5b) is provided. The spare row decoder selecting signal generation circuit (18) can be previously set so as to generate a spare row decoder selecting signal (SRE) when a defective row exists in either of the memory cell arrays (1a, 1b) and the defective row is selected by row decoder groups (4a, 4b). Each of the spare row decoders (5a, 5b) is activated in response to the spare row decoder selecting signal (SRE) and a block control signal.

5 Claims, 14 Drawing Sheets

13n: WORD DRIVER
14n: SENSE AMPLIFIER

SEMICONDUCTOR MEMORY DEVICE WITH REDUNDANCY CIRCUIT

This application is a continuation of application Ser. No. 08/882,758 filed Jun. 26, 1997, now U.S. Pat. No. 5,982,678, which is a continuation of application Ser. No. 08/626,408 filed Apr. 2, 1996, now abandoned, which is a continuation of application Ser. No. 08/180,166 filed Jan. 11, 1994, now U.S. Pat. No. 5,504,713, which is a continuation of application Ser. No. 07/958,466 filed Oct. 8, 1992, now U.S. Pat. No. 5,289,417, which is a continuation of application Ser. No. 07/516,644 filed Apr. 30, 1990, now abandoned.

BACKGROUND OF THE INVENTION

1. Field of the Invention

The present invention relates generally to semiconductor memory devices, and more particularly, to a semiconductor memory device with a redundancy circuit.

2. Description of the Background Art

Figure 6:
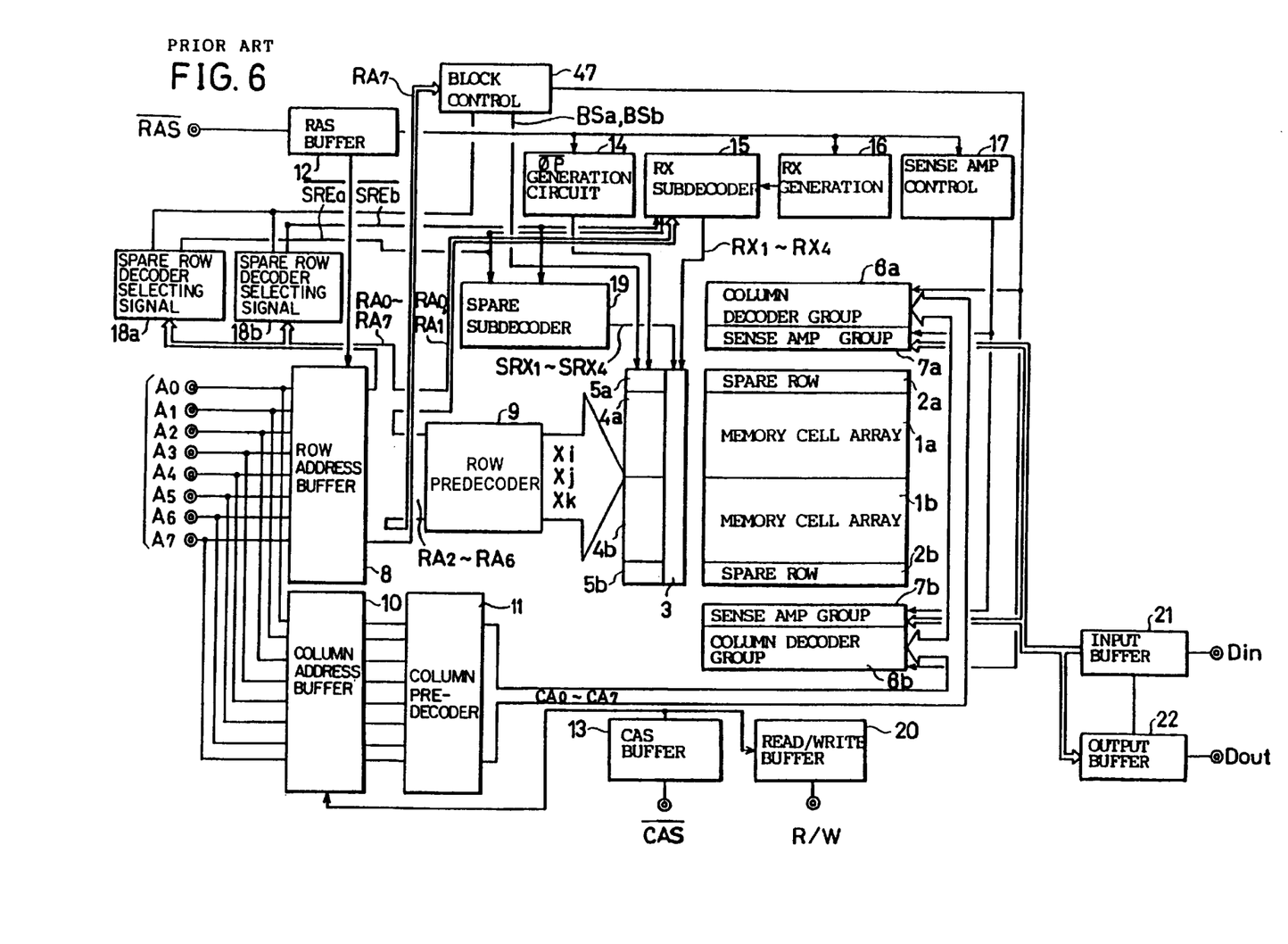
FIG. 6 is a block diagram showing a structure of a conventional semiconductor memory device.

FIG. 6 is a block diagram showing a structure of a conventional semiconductor memory device with a redundancy circuit. A redundancy circuit is a preliminary circuit for improving yield in manufacture and comprises a spare memory cell, a spare decoder and the like.

The semiconductor memory device of FIG. 6 receives address signals A0–A7 and has a storage capacity of 64k bits. A memory cell array of this semiconductor memory device performs a ½ block divisional operation.

In FIG. 6, each of memory cell arrays 1a and 1b includes a plurality of memory cells arranged in a plurality of rows and columns. Spare rows 2a and 2b including spare memory cells arranged in a plurality of rows are respectively provided at opposite sides of the memory cell arrays 1a and 1b.

In response to an externally applied row address strobe signal $\overline{RAS}$, a RAS buffer 12 activates a row address buffer 8, a $\overline{\phi p}$ generation circuit 14, a RX generation circuit 16 and a sense amplifier control circuit 17. The $\overline{\phi p}$ generation circuit 14 and the RX generation circuit 16 generates a precharge signal $\overline{\phi p}$ and a driving signal RX at predetermined timings, respectively.

A CAS buffer 13 activates a column address buffer 10 and a read/write buffer 20, in response to an externally applied column address strobe signal $\overline{CAS}$. The row address buffer 8 latches the externally applied address signals A0–A7 and supplies one part of the signals as row address signals RA2–RA6 to a row predecoder 9, the other part of the signals as row address signals RA0 and RA1 to a RX sub-decoder 15 and the rest as row address signal RA7 to a block controlling signal generation circuit 47.

The row predecoder 9 predecodes the address signals RA2–RA6 supplied from the row address buffer 8 and applies row selecting signals Xi, Xj and Xk to row decoder groups 4a and 4b.

In response to the precharge signal $\overline{\phi p}$ from the $\overline{\phi p}$ generation circuit 14, the row decoder groups 4a and 4b select four rows in the memory cell array 1a or 1b based on the row selecting signals Xi, Xj and Xk.

The RX sub-decoder 15, in response to the driving signal RX from the RX generation circuit 16, applies subdecoding signals RX1–RX4 to a word driver group 3, based on the row address signals RA0–RA1 applied from the row address buffer 8.

The word driver group 3 drives a word line of one row out of four rows selected by the row decoder groups 4a or 4b, in response to the subdecoding signals RX1–RX4.

The column address buffer 10 latches the externally applied address signals A0–A7 and applies the same as column address signals CA0–CA7 to a column predecoder 11. The column predecoder 11 predecodes the column address signals CA0–CA7 and applies a column selecting signal to column decoder groups 6a and 6b. The column decoder groups 6a and 6b select one column in the memory cell array 1a or 1b, based on the column selecting signal.

The block controlling signal generation circuit 47, in response to the row address signal RA7, generates block controlling signals (block selecting signals) $\overline{BSa}$ and $\overline{BSb}$ for selecting the memory cell array 1a or 1b which is to be operated.

In response to the row address signals RA0–RA7, spare row decoder selecting signal generation circuits 18a and 18b (referred to simply as a selecting signal generation circuit, hereinafter) respectively generate spare row decoder selecting signals $\overline{SREa}$ and $\overline{SREb}$ which deactivate the subdecoding signals RX1–RX4 and activate one of spare row decoders 5a and 5b. A spare RX subdecoder 19 receives the spare row decoder selecting signals $\overline{SREa}$ and $\overline{SREb}$ to generate the spare subdecoding signals SRX1–SRX4.

Thus, one word line and one bit line are selected to read or write information from/to a memory cell at an intersection point thereof. Reading and writing of the information is selected by the read/write buffer 20. The read/write buffer 20 activates an input buffer 21 or an output buffer 22, in response to an externally applied read/write signal R/W. When the input buffer 21 is activated, input data Din is written in thus selected memory cell. When the output buffer 22 is activated, the information stored in thus selected memory cell is read out as output data Dout.

Figure 7:
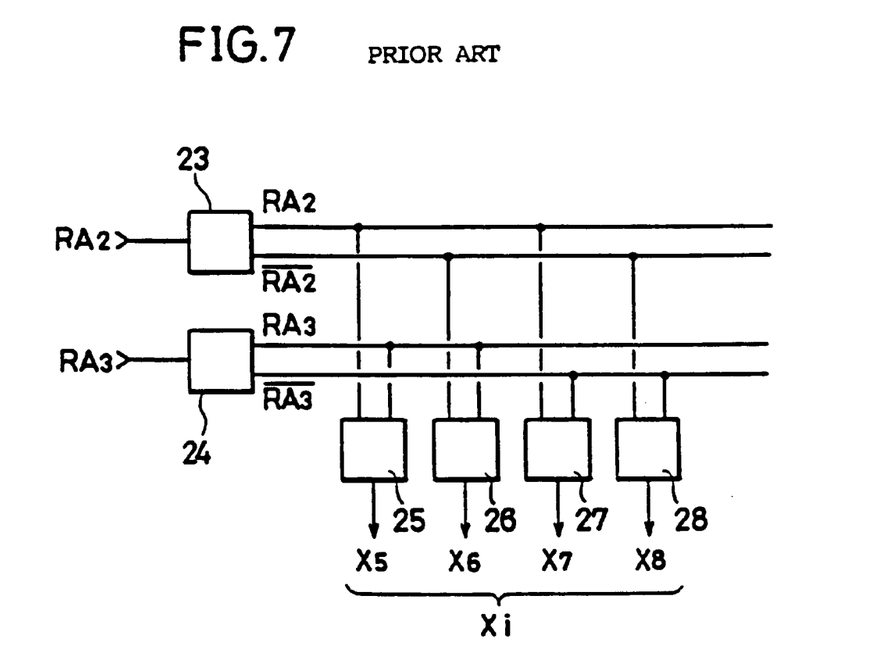
FIGS. 7, 8 and 9 are block diagrams showing structures of the respective portions of the row predecoder shown in FIG. 6.

FIG. 7 is a diagram showing a structure of a part of the row predecoder 9 shown in FIG. 6, wherein shown is a circuit portion for generating the row selecting signal Xi. Xi represents one of X5, X6, X7 and X8.

A gate circuit 23 receives the row address signal RA2 and outputs the same and an inversion signal $\overline{RA2}$ of the same. A gate circuit 24 receives the row address signal RA3 and outputs the same and an inversion signal $\overline{RA3}$ of the same. Either the signal RA2 or $\overline{RA2}$, and either the signal RA3 or $\overline{RA3}$ are inputted in gate circuits 25, 26, 27 and 28. The gate circuits 25, 26, 27 and 28 differ in combination of the signal RA2 or $\overline{RA2}$, and the signal RA3 or $\overline{RA3}$. Row selecting signals X5, X6, X7 and X8 are outputted from the gate circuits 25, 26, 27 and 28, respectively. In accordance with levels of the row address signals RA2 and RA3, one of the row selecting signals X5, X6, X7 and X8 attains the "H" (logical high) level and the rest of the signals attain the "L" (logical low) level.

Figure 8:
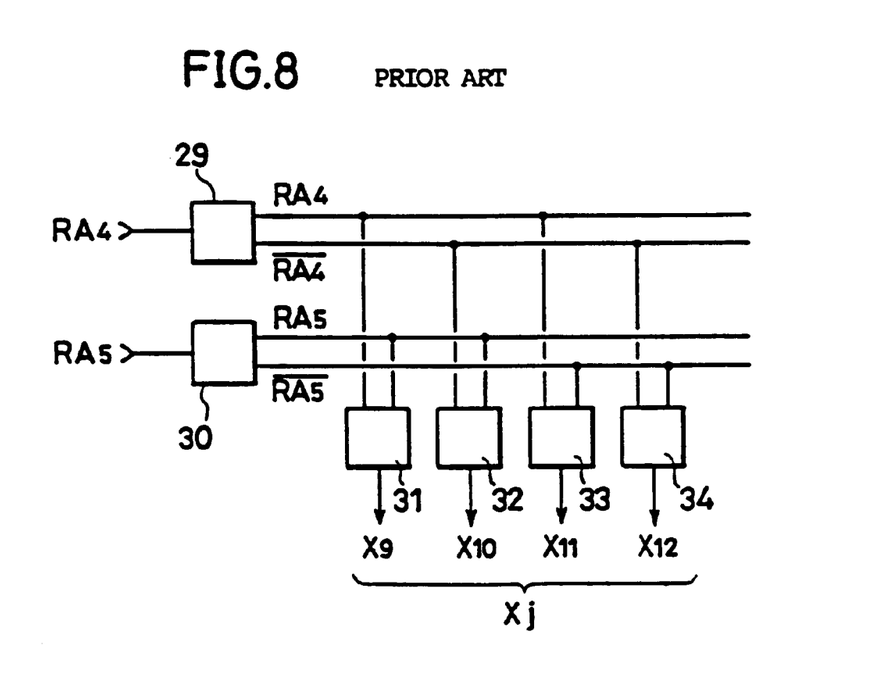

FIG. 8 is a diagram showing a structure of another part of the row predecoder 9 shown in FIG. 6, wherein shown is a circuit portion for generating the row selecting signal Xj. Xj represents any of X9, X10, X11 and X12.

The circuit portion of FIG. 8 includes gate circuits 29–34. Structure and operation of this circuit portion are the same as those of the circuit portion of FIG. 7.

The gate circuit 29 receives the row address signal RA4 and the gate circuit 30 receives the row address signal RA5. The gate circuits 31, 32, 33 and 34 output the row selecting signals X9, X10, X11 and X12, respectively. In accordance with levels of the row address signals RA4 and RA5, one of the row selecting signals X9, X10, X11 and X12 attains the "H" level and all of the rest attain the "L" level.

Figure 9:
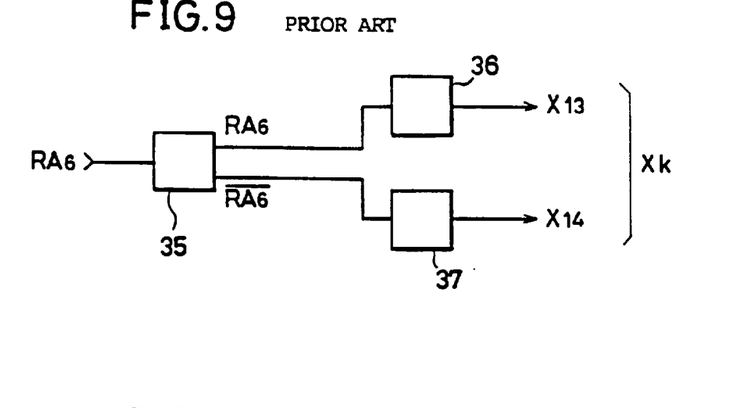

FIG. 9 is a circuit diagram showing a structure of still another part of the row predecoder 9 shown in FIG. 6, wherein shown is a circuit portion for generating the row selecting signal Xk. Kk represents either X13 or X14.

A gate circuit 35 receives the row address signal RA6 and outputs the same and an inversion signal $\overline{RA6}$ of the same row. Gate circuits 36 and 37 output row selecting signals X13 and X14, respectively. In accordance with a level of the row address signal RA6, either one of the row selecting signals X13 and X14 attains the "H" level and the other attains the "L" level.

Figure 10:
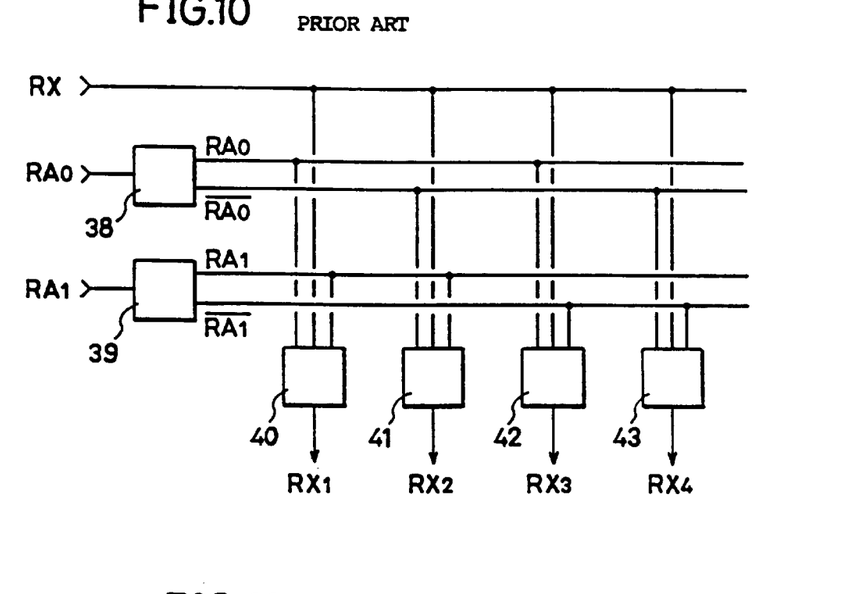
FIG. 10 is a block diagram showing a structure of the RX subdecoder shown in FIG. 6.

FIG. 10 is a diagram showing a structure of the RX subdecoder 15 shown in FIG. 6. In accordance with levels of the row address signals RA0, RA1, and the inversion signals $\overline{RA0}$ and $\overline{RA1}$, an RX1 generation circuit 40, a RX2 generation circuit 41, a RX3 generation circuit 42 and a RX4 generation circuit 43 output subdecoding signals RX1, RX2, RX3 and RX4, respectively.

Figure 11:
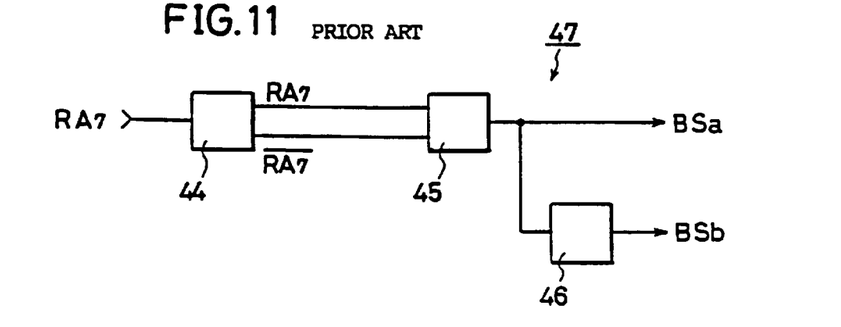
FIG. 11 is a block diagram showing a structure of the block controlling signal generation circuit shown in FIG. 6.

FIG. 11 is a diagram showing a structure of a part of the block controlling signal generation circuit 47 shown in FIG. 6. A gate circuit 44 receives the row address signal RA7 and outputs the same and an inversion signal $\overline{RA7}$ of the same. A gate circuit 45 outputs block controlling signals BSa and BSb. In accordance with a level of the row address signal RA7, either one of the block controlling signals BSa and BSb attains the "H" level and the other attains the "L" level.

Figure 12:
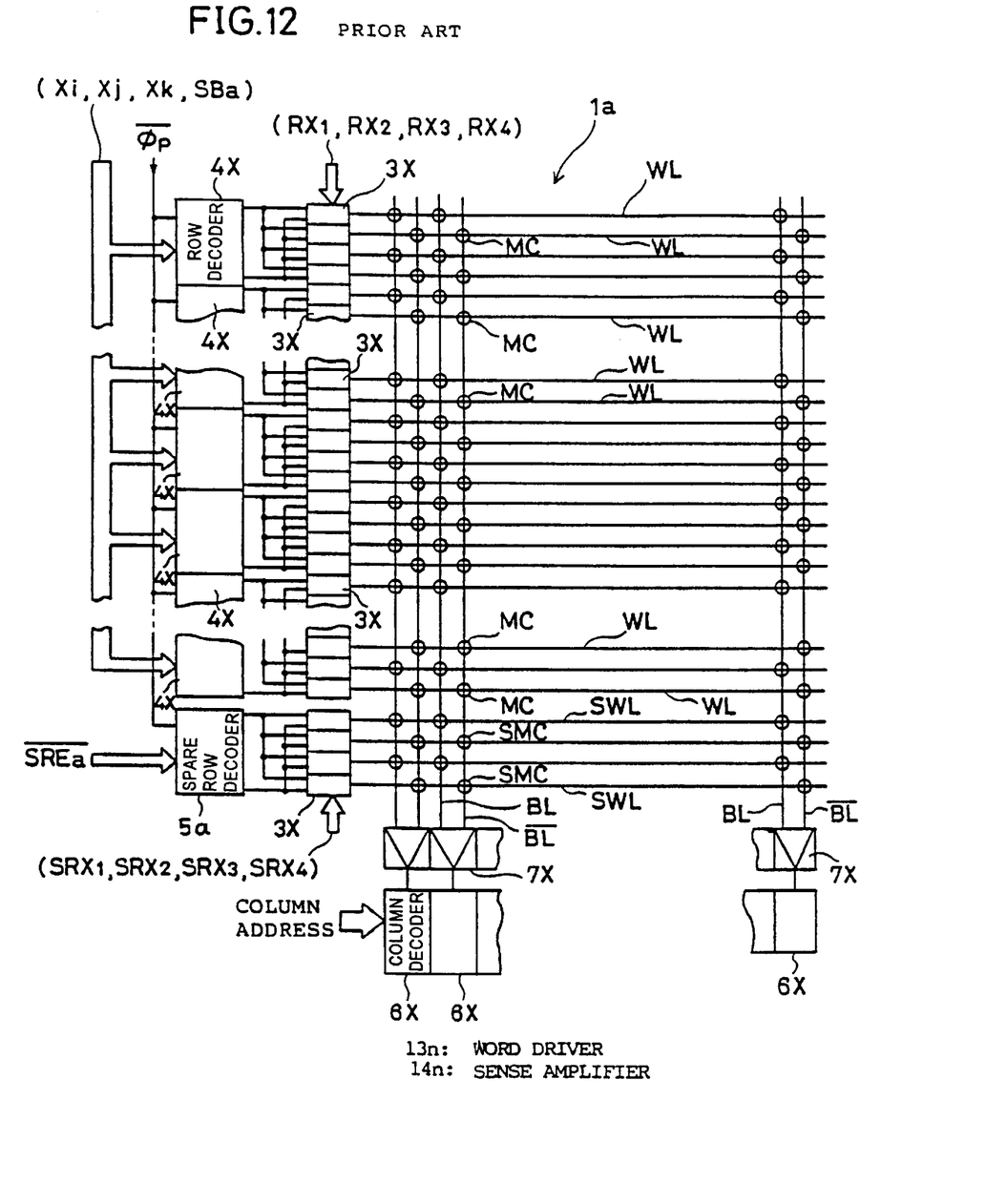
FIG. 12 is a diagram showing a detailed structure of the memory cell array and the peripheral portion thereof shown in FIG. 6.

FIG. 12 is a diagram showing a detailed structure of the memory cell array 1a and a peripheral portion thereof shown in FIG. 6.

4m word lines WL and a plurality of pairs of bit lines BL and $\overline{BL}$ are arranged so as to intersect with each other in the memory cell array 1a. m is a positive integer here. In addition, four spare word lines SWL are arranged at the opposite sides of the word lines WL. A memory cell MC is provided at each of intersections between each word line WL and a bit line pair BL and $\overline{BL}$, and a spare memory cell SMC is provided at each of intersections between a spare word line SWL and a bit line pair of BL and $\overline{BL}$.

In accordance with the 4m word lines WL and four spare word lines SWL, (4m+4) word line drivers 3X are provided. Each of the word lines WL and each of the spare word lines SWL are connected to their corresponding word drivers 3X. The 4m word lines WL and the word drivers 3X are divided into m groups each comprising four word lines WL and four word drivers 3X. m numbers of row decoders 4Xs are provided with respect to these m groups. Each row decoder 4X selects four word drivers 3X corresponding thereto.

In addition, one spare row decoder 5a is provided with respect to the four spare word lines SWL and four word drivers 3X. The spare row decoder 5a selects the corresponding four word drivers 3X.

On the other hand, a plurality of sense amplifiers 7X and a plurality of column decoders 6X are provided in accordance with the plurality of pairs of bit line BL and $\overline{BL}$. Each of the bit line pair BL and $\overline{BL}$ is connected to the corresponding sense amplifier 7X and the corresponding column decoder 6X.

When a defective memory call or a defective word line is formed in the above described memory cell 1a, the spare row decoder 5a is selected in place of the row decoder 4X corresponding to the defective memory cell or the defective word line.

Figure 13:
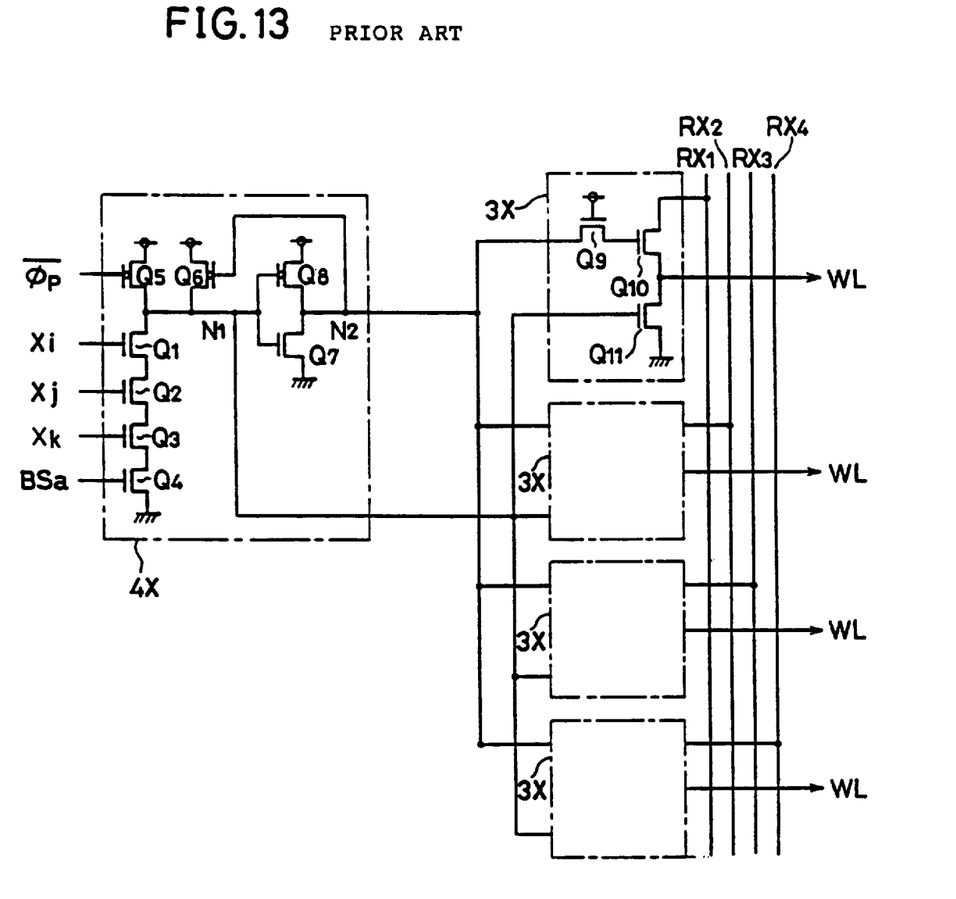
FIG. 13 is a specific circuit diagram of a row decoder and a word driver shown in FIG. 12.

FIG. 13 is a diagram showing specific circuit structures of the row decoder 4X and the word driver 3X shown in FIG. 12.

The row decoder 4X comprises N channel MOS transistors Q1–Q4, Q7 and P channel MOS transistors Q5, Q6, and Q8. A precharge signal $\overline{\phi p}$ is applied to a gate of the transistor Q5 and a gate of the transistor Q6 is connected to a node N2. Row selecting signals Xi, Xj and Xk are applied to gates of the transistors Q1–Q3, respectively and a block controlling signal BSa is applied to a gate of the transistor Q4. The transistors Q7 and Q8 form an inverter. Accordingly, polarity of the signal at the node N2 is opposite to that of the signal at a node N1.

The nodes N1 and N2 of the row decoder 4X are connected to the corresponding four word drivers 3Xs. The word driver 3X comprises N channel MOS transistors Q9–Q11. The transistor Q10 is connected between one of the subdecoding signals RX1–RX4 and one word line WL.

Now, operation of the circuit of FIG. 13 will be described. When the precharge signal $\overline{\phi p}$ is at the "L" level, the transistor Q5 is turned on and a potential of the node N1 is at the "H" level. Therefore, the transistor Q11 of the word driver 3X is turned on, so that the potential on the word line WL is at the "L" level. When the precharge signal $\overline{\phi p}$ rises to the "H" level, the transistor Q5 is turned off. When all of the row selecting signals xi, xj, xk and the block controlling signal BSa applied to the gates of the transistors Q1–Q4 attain the "H" level, all of the transistors Q1–Q4 are turned on. As a result, the potential of the node N1 attains the "L" level and the potential of the node N2 attains the "H" level. As a result, the transistor Q10 of the word driver 3X is turned on and the transistor Q11 is turned off. When any one of the subdecoding signals RX1–RX4 rises to the "H" level, a potential on the corresponding word line WL attains the "H" level.

Figure 14:
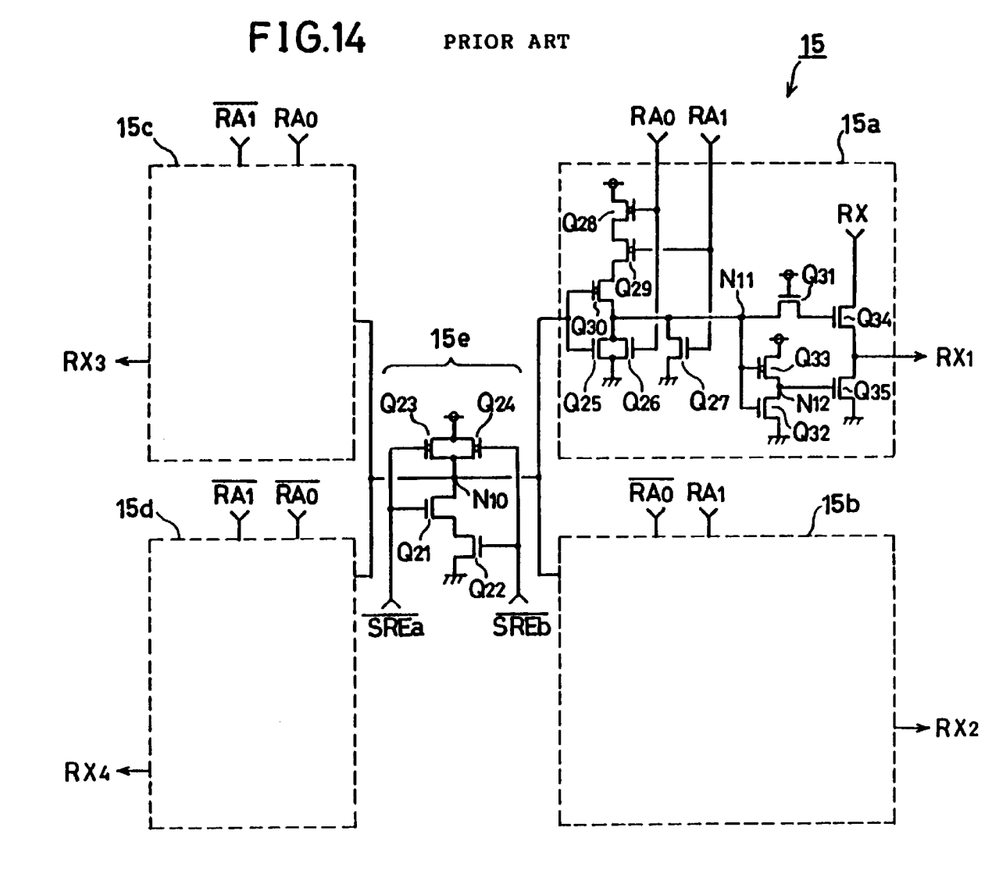
FIG. 14 is a circuit diagram showing a structure of the RX subdecoder shown in FIG. 6.

FIG. 14 is a diagram showing the structure of the RX subdecoder 15 shown in FIG. 6.

A circuit portion 15e of the RX subdecoder 15 comprises N channel MOS transistors Q21, Q22 and P channel MOS transistor Q23 and Q24. A circuit portion 15a comprises N channel MOS transistors Q25–Q27, Q31, Q32, Q34 and Q35, and P channel MOS transistors Q28–Q30 and Q33. An NAND circuit comprised of the transistors Q21–Q24 receives spare row decoder selecting signals $\overline{SREa}$ and $\overline{SREb}$ and generates inversion signals thereof. An NOR circuit comprised of the transistors Q25–Q30 receives a signal generated from the NAND circuit comprised of the transistors Q21–Q24, the row address signal RA0 or $\overline{RA0}$, and the row address signal RA1 or $\overline{RA1}$.

Structures of circuit portions 15b, 15c and 15d are the same as that of the circuit block 15a.

When the spare row decoder selecting signal $\overline{SREa}$ or $\overline{SREb}$ attains the "L" level, a potential of a node N10 attains the "H" level. As a result, the circuit portions 15a–15d are deactivated. When both of the spare row decoder selecting signals $\overline{SREa}$ and $\overline{SREb}$ attain the "H" level, the circuit portions 15a–15d are activated. In accordance with levels of the row address signals RA0 and RA1, any one of the subdecoding signals RX1–RX4 attains the "H" level.

Figure 15:
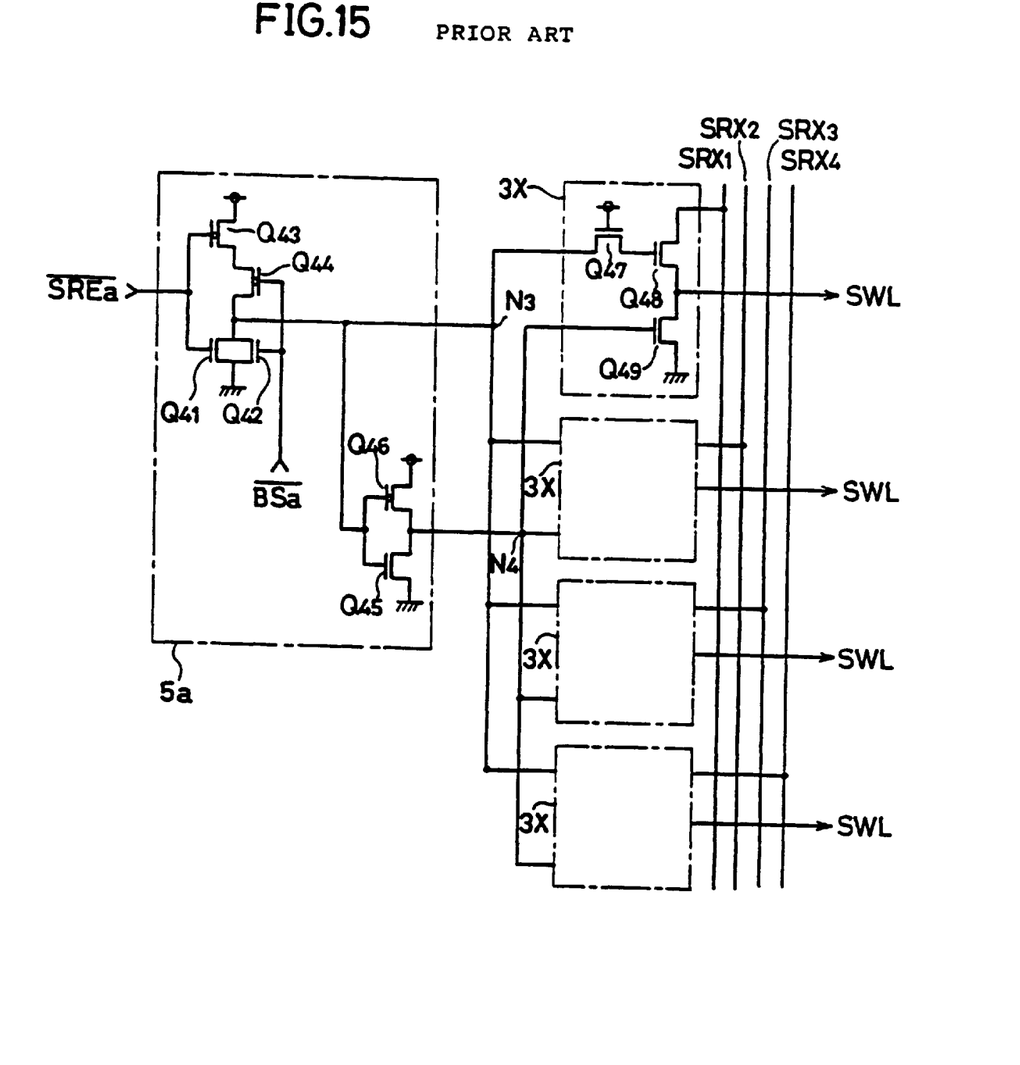
FIG. 15 is a specific circuit diagram of a spare row decoder shown in FIG. 12.

FIG. 15 is a diagram showing a specific circuit structure of the spare row decoder 5a shown in FIG. 12.

The spare row decoder 5a comprises N channel MOS transistors Q41, Q42 and Q45 and P channel MOS transistors Q43, Q44 and Q46. An NOR circuit comprised of the transistors Q41–Q44 receives the spare row decoder selecting signal $\overline{SREa}$ for deactivating the subdecoding signals RX1–RX4 and activating the spare row decoder 5a, and an inversion signal $\overline{BSa}$ of the block controlling signal BSa for selecting the memory cell array 1a. An inverter comprised of the transistors Q45 and Q46 receives a signal outputted from the NOR circuit and generates an inversion signal thereof.

When both of the spare row decoder selecting signal $\overline{SREa}$ and the inversion signal $\overline{BSa}$ of the block control signal BSa are at the "L" level, a potential of a node N3 attains the "H" level and a potential of a node N4 attains the "L" level. Therefore, the transistor Q48 in the word driver 3X is turned on, and the transistor Q49 is turned off. When one of the spare subdecoding signals SRX1–SRX4 rises to the "H" level, a potential on the corresponding word line WL attains the "H" level.

Figure 16:
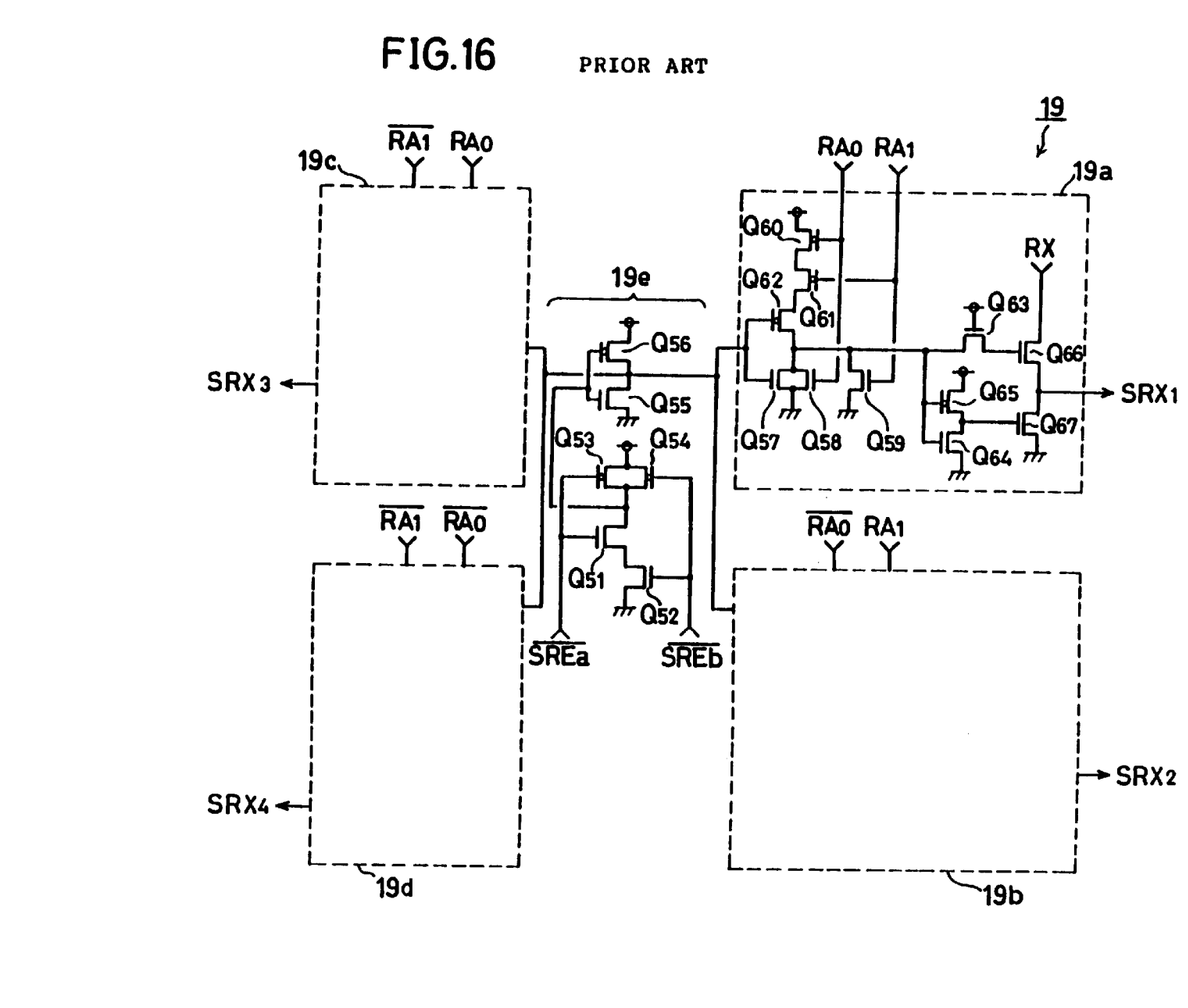
FIG. 16 is a circuit diagram showing a structure of the spare RX subdecoder shown in FIG. 6.

FIG. 16 is a diagram showing a circuit structure of the spare RX subdecoder 19 shown in FIG. 6.

A circuit portion 19e of the spare RX subdecoder 19 comprises N channel MOS transistors Q51, Q52 and Q55, and P channel MOS transistors Q53, Q54 and Q56. A circuit portion 19a comprises N channel MOS transistors Q57–Q59, 063, Q64, Q66 and Q67, and P channel MOS transistors Q60–Q62 and Q65.

An NAND circuit comprised of the transistors Q51–Q54 receives the spare row decoder selecting signals $\overline{SREa}$ and $\overline{SREb}$ and generates inversion signals thereof. The inversion signals are further inverted by an inverter comprised of the transistors Q55 and Q56. An NOR circuit comprised of the transistors Q57–Q62 receives an output of the inverter, either one of the row address signals RA0 and $\overline{RA0}$, and either one of the row address RA1 and $\overline{RA1}$.

Structures of the circuit portions 19b, 19c and 19d are the same as that of the circuit portion 19a.

When both of the spare row decoder selecting signals $\overline{SREa}$ and $\overline{SREb}$ are at the "H" level, all of the spare subdecoding signals SRX1–SRX4 enter a non-selected state. On the other hand, when either the spare row decoder selecting signal $\overline{SREa}$ or $\overline{SREb}$ is at the "L" level, one of the spare subdecoding signals SRX1–SRX4 enters a selected state in accordance with levels of the row address signals RA0 and $\overline{RA0}$ and levels of the row address signals RA1 and $\overline{RA1}$.

Figure 17:
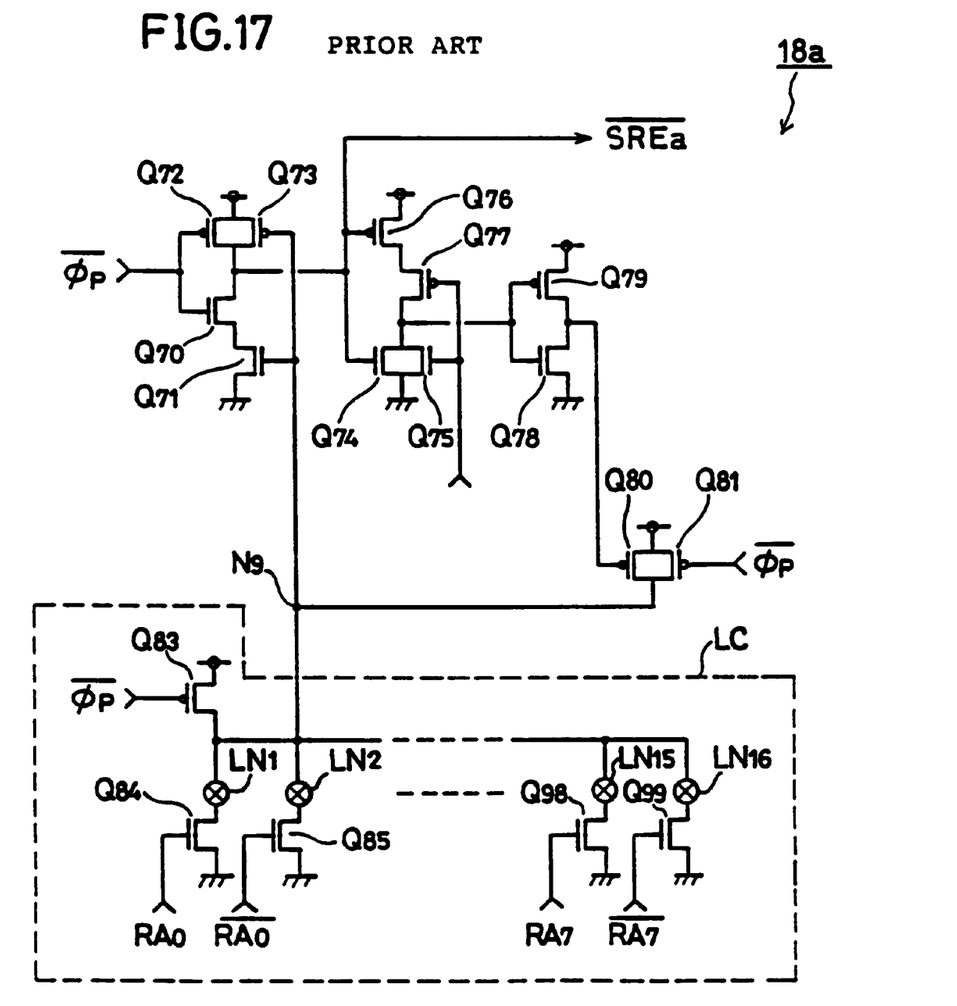
FIG. 17 is a circuit diagram showing a structure of the spare row decoder selecting signal generation circuit shown in FIG. 6.

FIG. 17 is a circuit diagram showing the selecting signal generation circuit 18a shown in FIG. 6.

The selecting signal generation circuit 18a comprises P channel MOS transistors Q72, Q73, Q76–Q77, Q79–Q81 and Q83, N channel MOS transistors Q70, Q71, Q74, Q75, Q78 and Q84–Q99, and link elements LN1–LN16.

Ordinarily, the link elements LN1–LN16 are connected. Therefore, if any of the row address signals RA1, $\overline{RA1}$–RA7, and $\overline{RA7}$ attains the "H" level, the corresponding one of the transistors Q84–Q99 is turned on. As a result, a potential of a node N9 attains the "L" level and the spare row decoder selecting signal $\overline{SREa}$ attains the "H" level. In this case, no spare word line is selected.

When there exists a defective word line, predetermined link elements are previously blown out by laser beam. More specifically, a link element connected to a transistor receiving a row address signal which attains the "H" level when the defective word line is selected, is previously blown out by the laser beam. As a result, even if a row address signal for selecting the defective word line is inputted to the transistors Q84–Q99, the potential of the node N9 does not drop but is held at the "H" level. Therefore, at a time point where the precharge signal $\overline{\phi p}$ rises to the "H" level, the spare row decoder selecting signal $\overline{SREa}$ falls to the "L" level.

FIG. 17 shows a structure of the selecting signal generation circuit 18a, and a structure of a selecting signal generation circuit 18b is the same.

As the foregoing, in case a defective word line exists, either the spare row decoder selecting signal $\overline{SREa}$ or $\overline{SREb}$ attains the "L" level when a row address signal for selecting the defective word line is inputted. Therefore, the potential at the node N10, the potential at the node N11 and the potential at the node N12 in FIG. 14 attain the "H" level, the "L" level and the "H" level, respectively. As a result, all of the subdecoding signals RX1–RX4 attain the "L" level.

In the foregoing, description is made on the memory cell array 1a shown in FIG. 6, structure and operation of the memory cell array 1b are the same as those of the memory cell array 1a.

As described above, in the semiconductor memory device of FIG. 6, two selecting signal generation circuits 18a and 18b are provided corresponding to the divided memory cell arrays 1a and 1b. As the foregoing, in a conventional semiconductor memory device performing a block divisional operation, the same number of spare row decoder selecting signal generation circuits as that of memory cell arrays (blocks) for performing a block divisional operation are required. Therefore, a region required for a circuit layout and interconnection is increased.

Such semiconductor memory device of FIG. 6 as comprising a plurality of spare rows and a plurality of regular disable generation circuits corresponding to a plurality of memory cell arrays is disclosed in Japanese Patent Laying-Open No. 60-103469.

SUMMARY OF THE INVENTION

An object of the present invention is to reduce a region required for circuit layout and interconnection circuit in a semiconductor memory device comprising a memory cell array in which a block divisional operation is performed and having a redundancy circuit for each memory cell array.

Another object of the present invention is to provide a semiconductor memory device in which a region required for circuit layout and interconnection for a spare decoder selecting signal generation circuit is reduced even if the number of divisions of a memory cell array in which a block divisional operation is performed is increased.

Still another object of the present invention is to reduce an area occupied by a spare decoder selecting signal generation circuit in a semiconductor memory device performing a block divisional operation and having a redundancy circuit.

A semiconductor memory device with a redundancy circuit according to the present invention comprises a memory cell array, a plurality of redundancy circuits and an activation signal generation circuit. The memory cell array includes a plurality of memory cells and is divided into a plurality of blocks. The plurality of redundancy circuits are provided corresponding to the plurality of blocks and can replace a part of the corresponding blocks. The activation signal generation circuit is used in common by the plurality of redundancy circuits and can be set so as to generate a redundancy circuit activation signal, when a part of the plurality of blocks is defective and a portion including the defective part is selected. Each of the plurality of redundancy circuits is activated in response to the redundancy circuit activation signal and a predetermined block selecting signal.

According to this semiconductor memory device, the plurality of redundancy circuits corresponding to the plurality of blocks of the memory cell arrays in which a block operation is performed use in common the redundancy circuit activation signal for activating a redundancy circuit. As a result, even if the number of blocks into which the memory arrays are divided is increased, it is possible to prevent increase of a region required for circuit layout and interconnection for the redundancy circuit activation signal.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

An embodiment of the present invention will be described in detail with reference to the drawings hereinafter.

Figure 1:
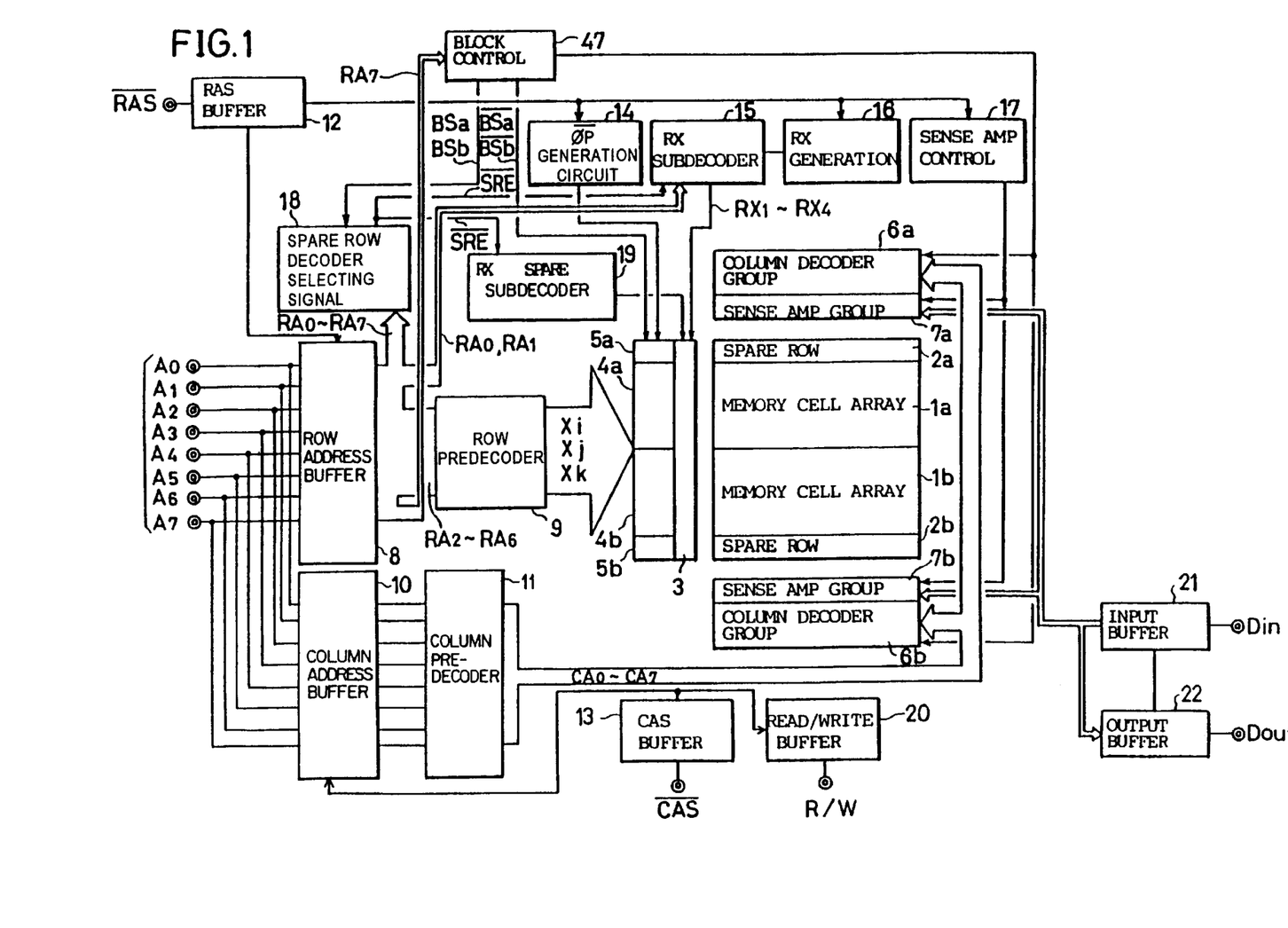
FIG. 1 is a block diagram showing a structure of a semiconductor memory device according to one embodiment of the present invention.

FIG. 1 is the block diagram showing the structure of the semiconductor memory device according to one embodiment of the present invention. This semiconductor memory device receives address signals A0–A7 and has a storage capacity of 64k bits. The semiconductor memory device comprises a memory cell array in which a ½ block divisional operation is performed.

The semiconductor memory device of FIG. 1 differs from that of FIG. 6 in that a spare row decoder selecting signal $\overline{SRE}$ for deactivating subdecoding signals RX1–RX4 and activating spare row decoders 5a and 5b, and a spare row decoder selecting signals generation circuit 18 (referred to simply as a selecting signal generation circuit, hereinafter) are used in common by memory cell arrays 1a and 1b in which the block divisional operation is performed.

Now described is an operation when a defective portion exists in the semiconductor memory device of FIG. 1. When an address signal for selecting a defective address is inputted, the row address signals RA0–RA7 generated by a row address buffer 8 are applied to the selecting signal generation circuit 18. The selecting signal generation circuit 18 outputs the spare row decoder selecting signal $\overline{SRE}$.

The spare row decoder selecting signal $\overline{SRE}$ deactivates the subdecoding signals RX1–RX4. In addition, the spare row decoder selecting signal $\overline{SRE}$ tries to activate the spare row decoders 5a and 5b. In case the defective portion in the memory cell array 1a is selected, a block controlling signal $\overline{BSa}$ is activated. When the defective portion in the memory cell array 1b is selected, a block controlling signal $\overline{BSb}$ is activated. As a result, either the spare row decoder 5a or 5b is activated.

In addition, one of the spare subdecoding signals SRX1–SRX4 is activated. As a result, the corresponding spare word line SWL is activated.

Figure 2:
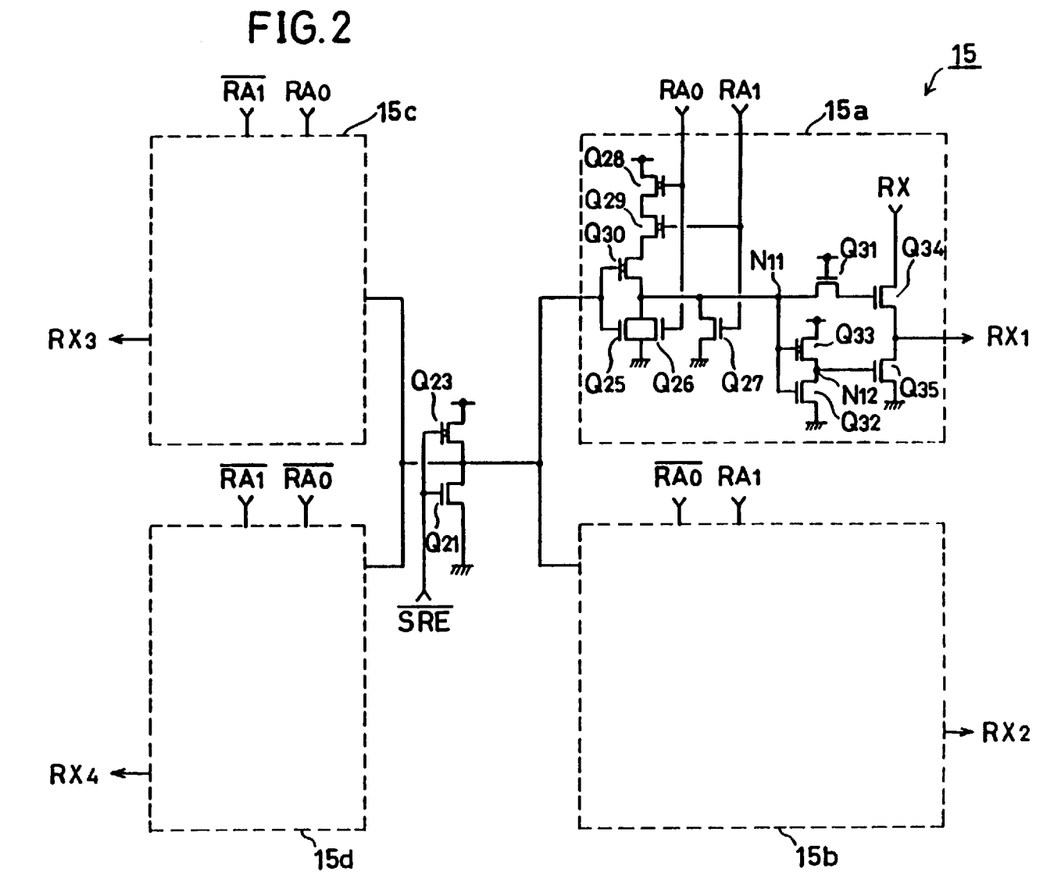
FIG. 2 is a circuit diagram showing a structure of a RX subdecoder included in the semiconductor memory device of FIG. 1.

FIG. 2 is a circuit diagram showing a specific structure of the RX subdecoder 15 included in the semiconductor memory of FIG. 1.

The RX sub-decoder 15 of FIG. 2 differs from that of FIG. 14 in that only the spare row decoder selecting signal $\overline{SRE}$ is inputted. In the RX sub-decoder 15 of FIG. 2, the spare row decoder selecting signal $\overline{SRE}$ is supplied to each of the circuit blocks 15a–15d through an inverter comprised of the transistors Q21 and Q23.

Figure 3:
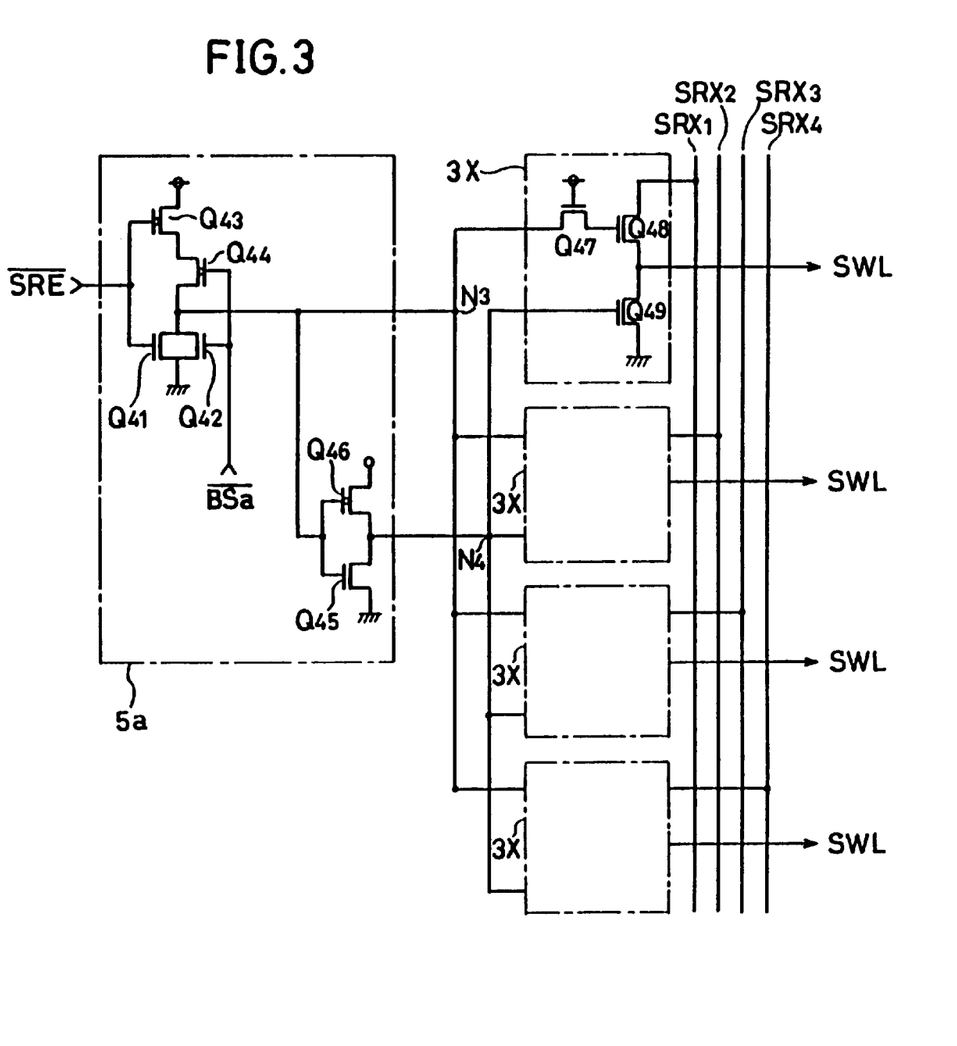
FIG. 3 is a circuit diagram showing a structure of a spare row decoder included in the semiconductor memory device of FIG. 1.

FIG. 3 is a circuit diagram showing structures of the spare row decoder 5a and the word driver 3X included in the semiconductor memory device of FIG. 1.

The spare row decoder 5a of FIG. 3 differs from that of FIG. 15 in that only the spare row decoder selecting signal $\overline{SRE}$ is inputted thereto. While only the spare row decoder 5a is shown in FIG. 3, a structure of the spare row decoder 5b is the same as that of the spare row decoder 5a. The spare row decoder selecting signal $\overline{SRE}$ is inputted to both of the spare row decoders 5a and 5b.

Figure 4:
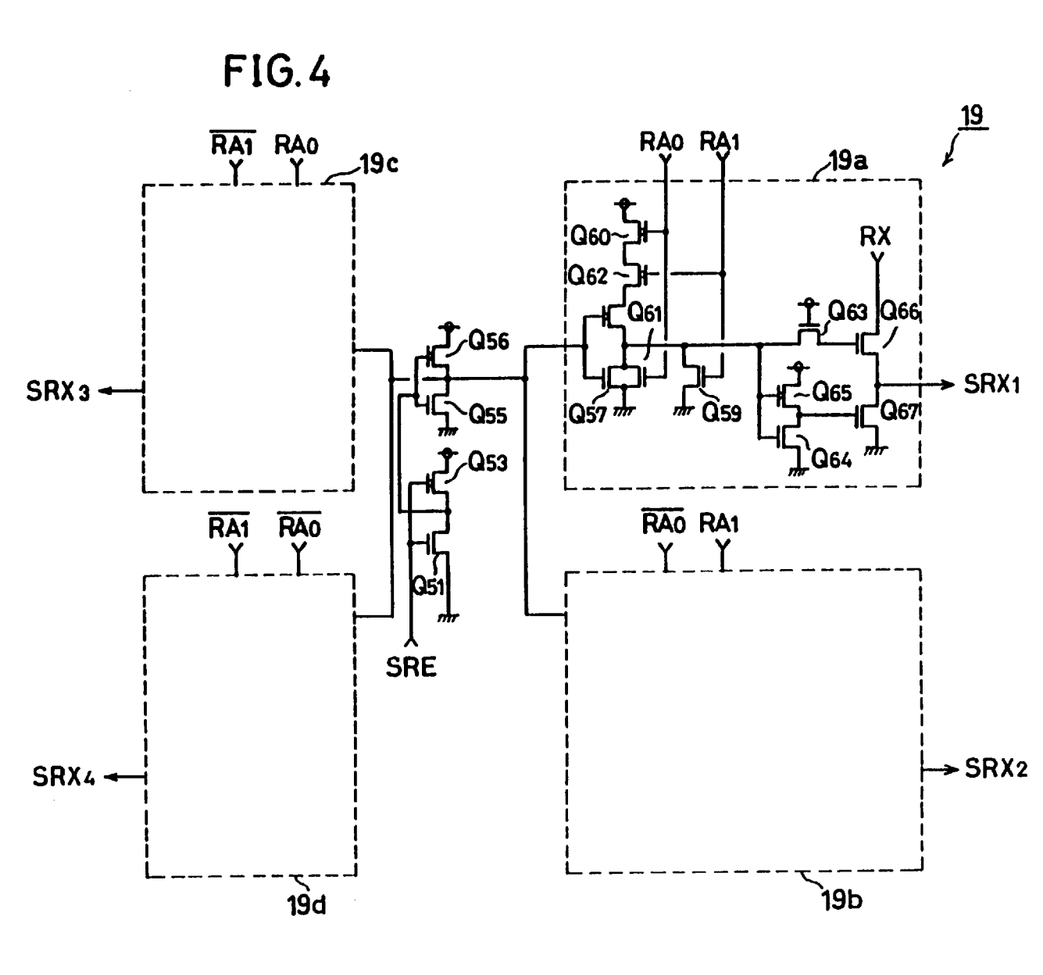
FIG. 4 is a circuit diagram showing a structure of a spare RX subdecoder included in the semiconductor memory device of FIG. 1.

FIG. 4 is a circuit diagram showing a structure of the spare RX subdecoding signal generation circuit 19 included in the semiconductor memory device of FIG. 1.

The spare RX subdecoding signal generation circuit 19 of FIG. 4 differs from that of FIG. 16 in that only the spare row decoder selecting signal $\overline{SRE}$ is inputted thereto. The spare row decoder selecting signal $\overline{SRE}$ is applied to an inverter comprised of transistors Q55 and Q56 through an inverter comprising transistors Q51 and Q53 and is further supplied to each of circuit blocks 19a–19d.

Figure 5:
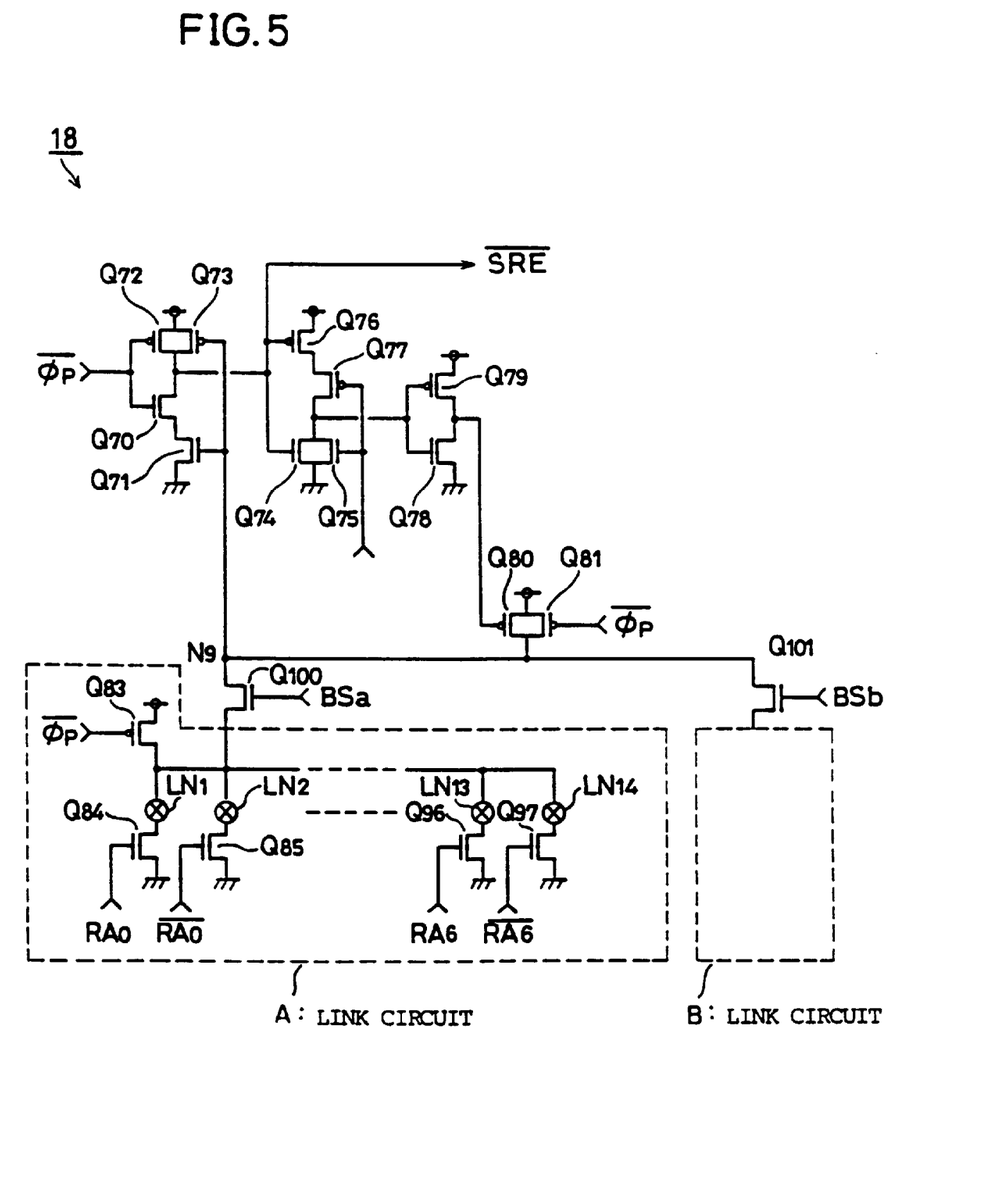
FIG. 5 is a circuit diagram showing a structure of a spare row decoder selecting signal generation circuit included in the semiconductor memory device of FIG. 1.

FIG. 5 is a circuit diagram showing a structure of the selecting signal generation circuit 16 included in the semiconductor memory device of FIG. 1.

Link circuits A and B respectively corresponding to the memory cell arrays 1a and 1b are provided in this selecting signal generation circuit 16. Each structure of the link circuits A and B is the same as that of the link circuit LC shown in FIG. 17.

According to the selecting signal generation circuit 16, even if an address signal corresponding to the defect in the memory cell array 1a is inputted and even if an address signal corresponding to the defect in the memory cell array 1b is inputted, the spare row decoder selecting signal $\overline{SRE}$ attains the "L" level.

In case a defective word line exists in the memory cell array 1a, predetermined link elements in the link circuit A are previously blown out by the laser beam. In case a defective word line exists in the memory cell array 1b, predetermined link elements in the link circuit B are previously blown out by the laser beam.

When a row address signal for selecting a defective word line in the memory cell array 1a is inputted in transistors Q84–Q99, the spare row decoder selecting signal $\overline{\text{SRE}}$ falls to the "L" level. In addition, also when a row address signal for selecting a defective word line in the memory cell array 1b is inputted in the link circuit B, the row decoder selecting signal $\overline{\text{SRE}}$ falls to the "L" level, thereby activating the spare RX subdecoder 19 shown in FIG. 4. As a result, in accordance with levels of the row address signals RA0 and RA1, one of the spare RX subdecoding signals SRX1–SRX4 enters a selected state.

When a defective word line in the memory cell array 1a is selected, the block controlling signal $\overline{\text{BSa}}$ attains the "L" level. As a result, an output (node N3) of the spare row decoder 5a shown in FIG. 3 attains the "H" level, thereby driving one of the spare word lines SWLs.

On the contrary, when the defective word line in the memory cell array 1b is selected, the block controlling signal $\overline{\text{BSb}}$ attains the "L" level. As a result, the output of the spare row decoder 5b attains the "H" level.

As the foregoing, in the above described embodiment, since the selecting signal generation circuit 18 and a part of the signal lines are used in common by the two spare row decoders 5a and 5b, a region required for a circuit layout and interconnection can be reduced.

While the above described embodiment, description is made on a semiconductor memory device in which a ½ block divisional operation is performed, the present invention can be applied to a semiconductor memory device comprising memory cell arrays divided into an arbitrarily number of blocks.

In addition, while in the above described embodiment, description is made on a semiconductor memory device with redundancy circuits arranged in a row address direction, the present invention can be applied to a semiconductor memory device with redundancy circuits arranged in a column address direction.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device comprising:

a plurality of lines each connected to memory cells;

a spare enable signal generation circuit including a plurality of address programming circuits each for programming a defective address associated with a defective line of said plurality of lines, for generating a common spare enable signal in response to outputs of the plurality of address programming circuits; and a plurality of spare decoders receiving the common spare enable signal in common, each for selecting a spare line connected to spare memory cells in response to the common spare enable signal and a corresponding block select signal.

2. A semiconductor memory device comprising:

a plurality of lines each connected to memory cells; and a plurality of programming circuits each for programming a defective address associated with a defective line of said plurality of lines, and only a part of said plurality of programming circuits each being enabled to output a valid result signal.

3. The semiconductor memory device according to claim 2, wherein each of said plurality of programming circuits provides the valid result designating whether the defective address programmed by the programming circuit and an externally applied address are in agreement when enabled.

4. The semiconductor memory device according to claim 2, wherein outputs of said plurality of programming circuits are coupled to a common node provided in common to said plurality of programming circuits.

5. A semiconductor memory device comprising:

a plurality of lines each connected to memory cells;

a plurality of programming circuits each for programming a defective address associated with a defective line of said plurality of lines and producing a detecting result designating whether the defective address and an externally applied address are in agreement; and a spare control line provided in common to said plurality of programming circuits and transmitting a spare control signal in response to the detecting results.

* * * * *